(12) United States Patent
Sohn et al.

(10) Patent No.: US 10,942,210 B2
(45) Date of Patent: Mar. 9, 2021

(54) REFLECTED-WAVE PROCESSING APPARATUS

(71) Applicant: KOREA ELECTRIC POWER CORPORATION, Naju-si (KR)

(72) Inventors: Song-Ho Sohn, Daejeon (KR); Sang-Cheol Han, Daejeon (KR); Hyung-Suk Yang, Daejeon (KR); Seong-Woo Yim, Daejeon (KR); Yong-June Shin, Seoul (KR); Geon-Seok Lee, Seoul (KR); Su-Sik Bang, Seoul (KR); Yeong-Ho Lee, Seoul (KR); Gu-Young Kwon, Seoul (KR)

(73) Assignee: KOREA ELECTRIC POWER CORPORATION, Naju-si (KR)

( * ) Notice: Subject to any disclaimer, the term of this patent is extended or adjusted under 35 U.S.C. 154(b) by 101 days.

(21) Appl. No.: 16/345,694

(22) PCT Filed: Nov. 22, 2016

(86) PCT No.: PCT/KR2016/013482
§ 371 (c)(1),
(2) Date: Apr. 26, 2019

(87) PCT Pub. No.: WO2018/079912
PCT Pub. Date: May 3, 2018

(65) Prior Publication Data
US 2019/0293706 A1 Sep. 26, 2019

(30) Foreign Application Priority Data
Oct. 31, 2016 (KR) .................. 10-2016-0142899

(51) Int. Cl.
*G01R 31/11* (2006.01)
*G01R 23/16* (2006.01)
(Continued)

(52) U.S. Cl.
CPC ............ *G01R 31/11* (2013.01); *G01R 23/16* (2013.01); *G01R 23/165* (2013.01); *G01R 31/08* (2013.01); *G01R 31/58* (2020.01)

(58) Field of Classification Search
CPC ...... G01R 31/11; G01R 23/16; G01R 23/165; G01R 31/08; G01R 31/58
See application file for complete search history.

(56) References Cited

U.S. PATENT DOCUMENTS

2006/0097730 A1* 5/2006 Park ................... G01R 31/11
324/534
2013/0069818 A1* 3/2013 Shirakawa ........... G01S 13/347
342/146
(Continued)

FOREIGN PATENT DOCUMENTS

JP 2003-315395 A 11/2003
KR 10-2012-0113076 A 10/2012
(Continued)

*Primary Examiner* — Roy Y Yi
*Assistant Examiner* — Geoffrey T Evans
(74) *Attorney, Agent, or Firm* — Foundation Law Group, LLP

(57) ABSTRACT

A reflected-wave processing apparatus according to one embodiment of the present invention may comprise: a reference signal generation unit for applying, to a cable, a first reference signal, the frequency of which increases over time, and a second reference signal, the frequency of which decreases over time; a reflected-signal acquisition unit for acquiring a first reflected signal and a second reflected signal which are reflected from the cable upon applying the first and second reference signals thereto; and a signal analysis unit for analyzing the first and second reflected signals.

12 Claims, 7 Drawing Sheets

(51) Int. Cl.
  *G01R 31/58*   (2020.01)
  *G01R 31/08*   (2020.01)
  *G01R 23/165*  (2006.01)

(56) References Cited

U.S. PATENT DOCUMENTS

| | | | |
|---|---|---|---|
| 2014/0139233 A1 | 5/2014 | Jeong | |
| 2014/0316726 A1* | 10/2014 | Franchet | G01R 31/11 702/59 |
| 2015/0338450 A1 | 11/2015 | El Sahmarany et al. | |
| 2016/0123720 A1* | 5/2016 | Thorpe | H04B 10/5165 356/498 |
| 2018/0328975 A1* | 11/2018 | Sallem | G01R 31/11 |
| 2020/0249266 A1* | 8/2020 | Jung | G01R 31/11 |

FOREIGN PATENT DOCUMENTS

| | | |
|---|---|---|
| KR | 10-2014-0065333 A | 5/2014 |
| KR | 10-1570506 B1 | 11/2015 |
| KR | 10-1579896 B1 | 12/2015 |
| KR | 10-1602407 B1 | 3/2016 |
| KR | 10-1645602 B1 | 8/2016 |
| KR | 10-2017-0052924 A | 5/2017 |

* cited by examiner

[Figure 1]
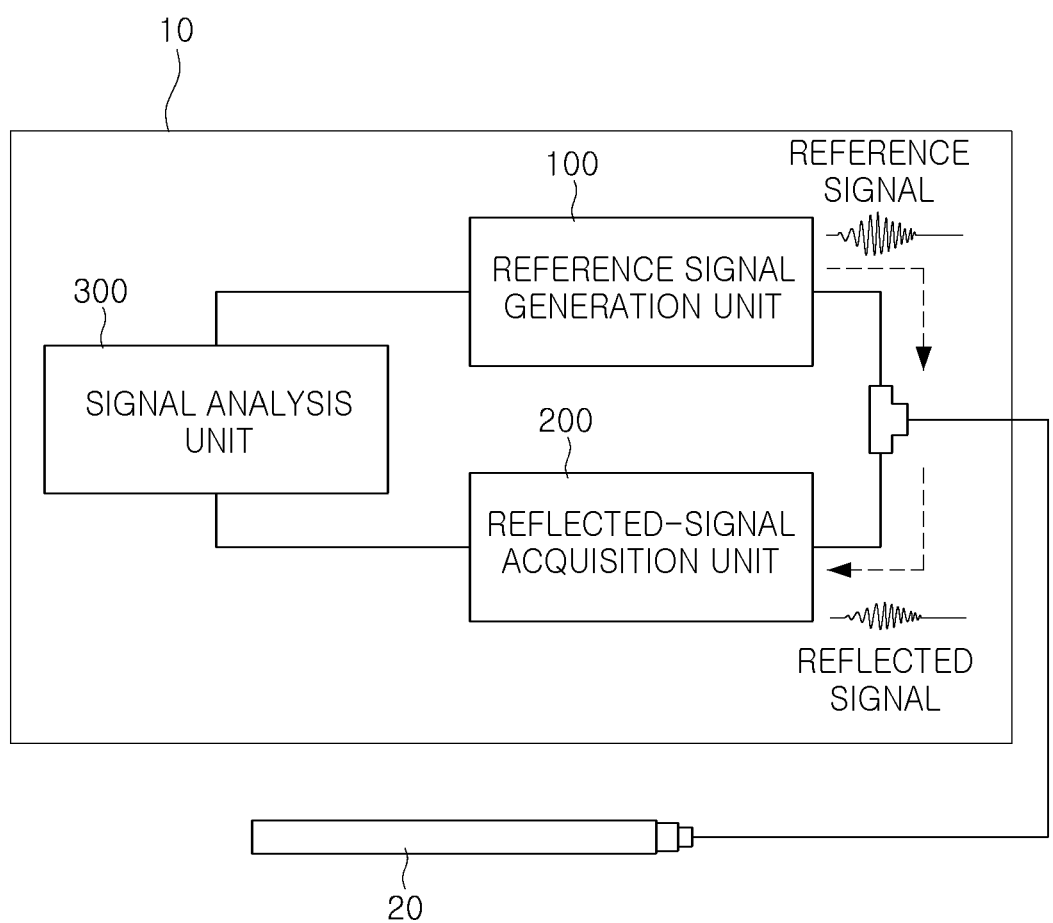

[Figure 2]
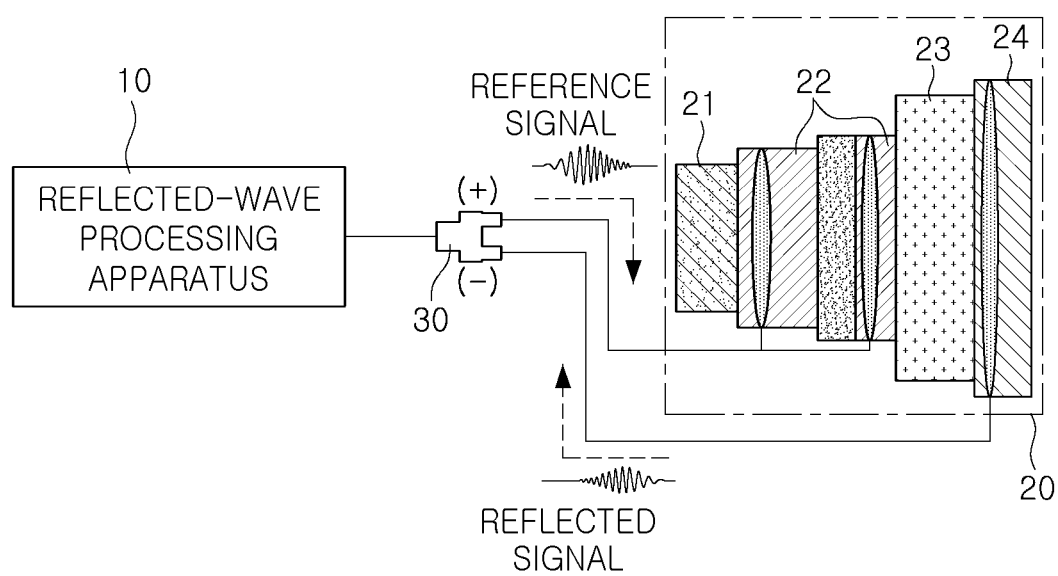

【Figure 3】
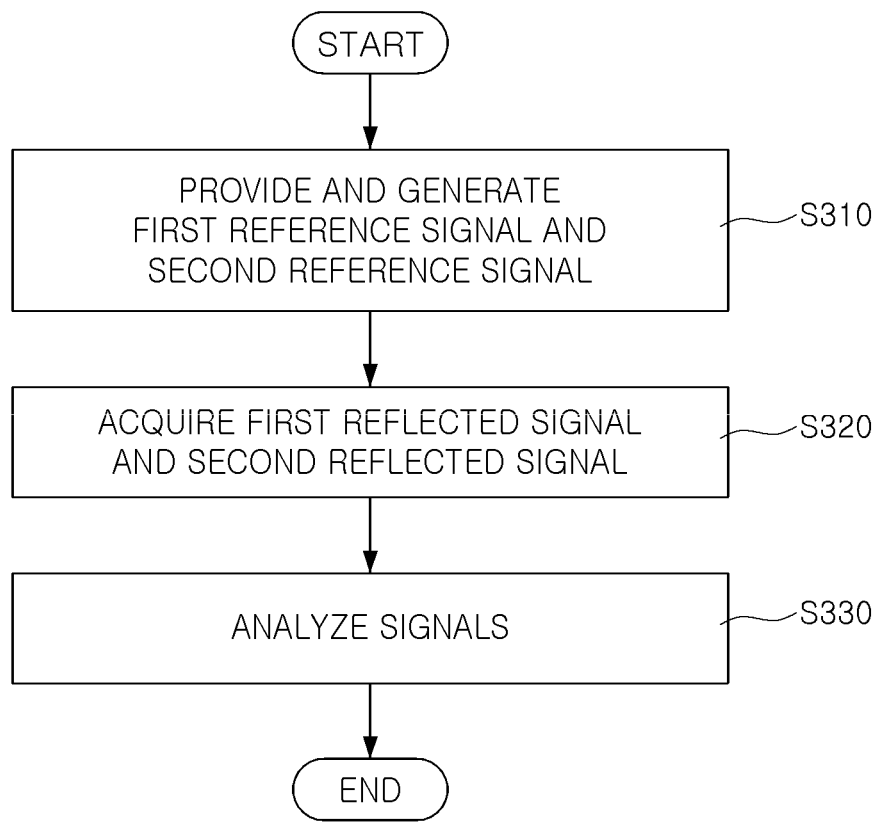

[Figure 4]
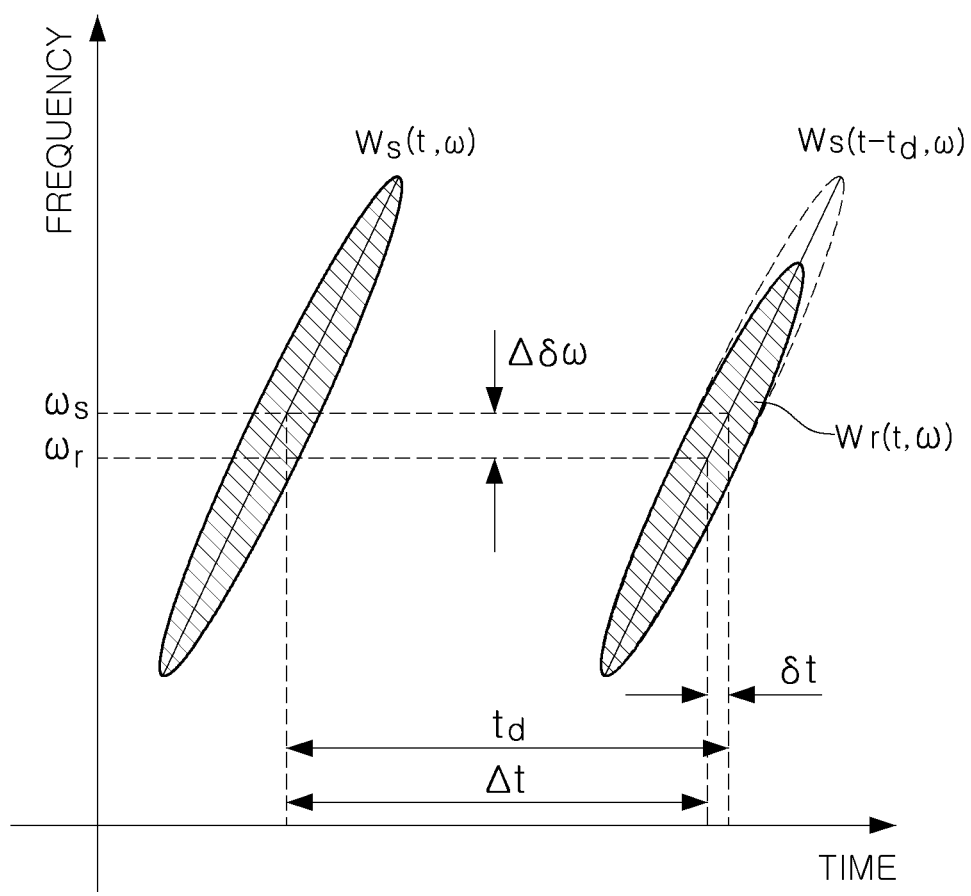

【Figure 5】
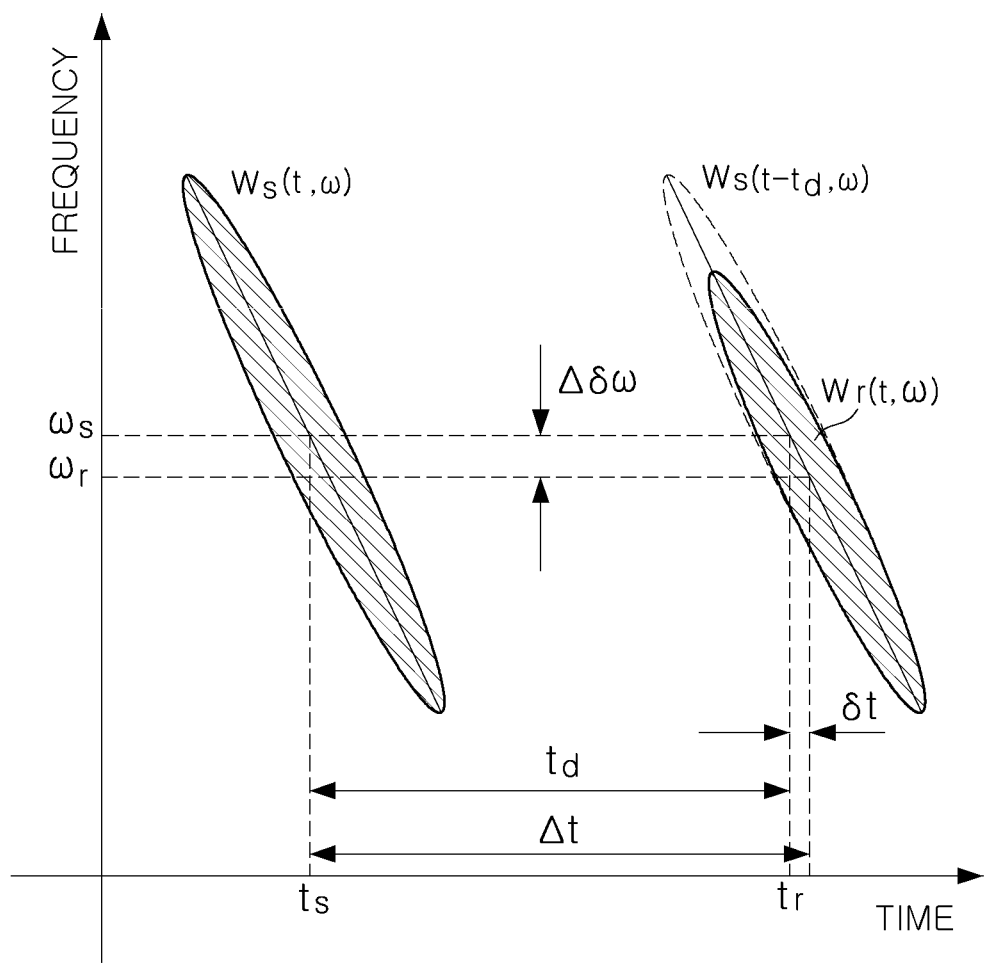

【Figure 6】
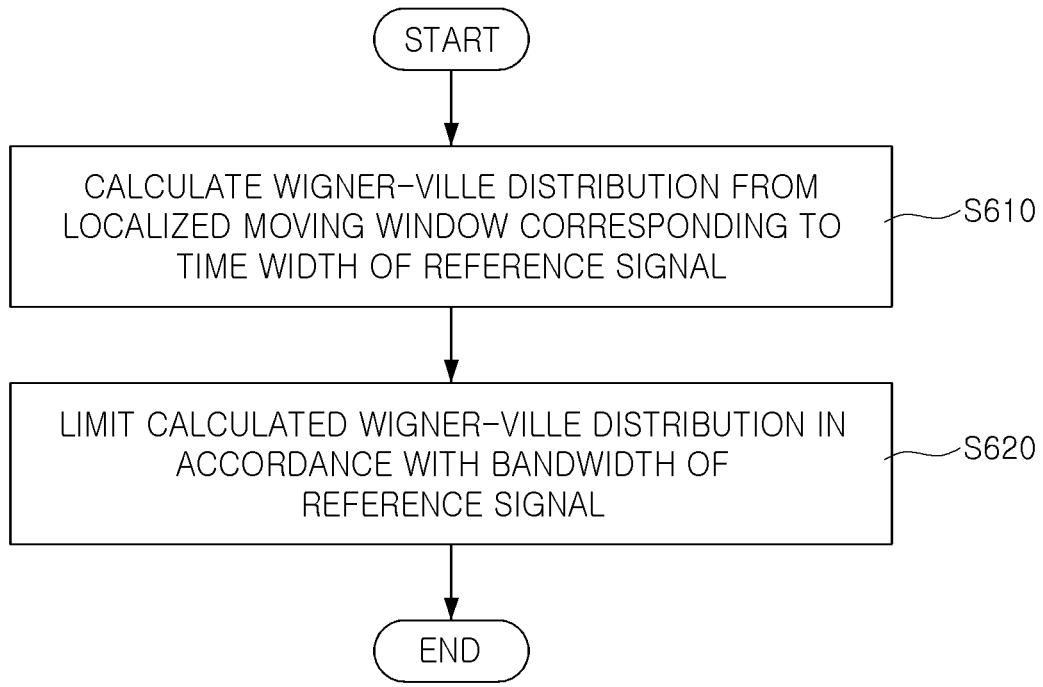

【Figure 7】
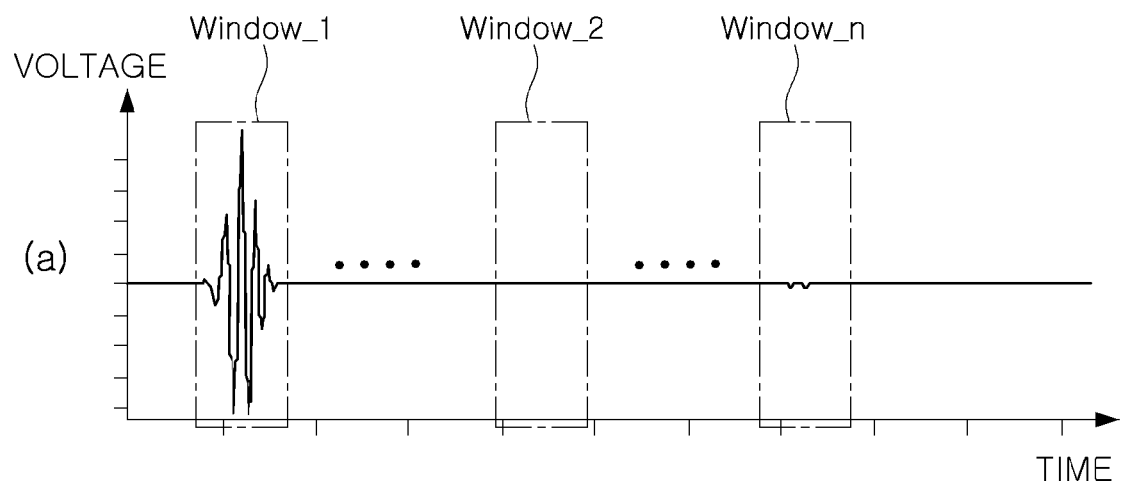
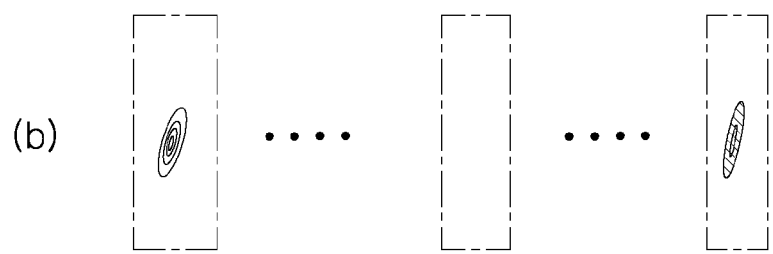
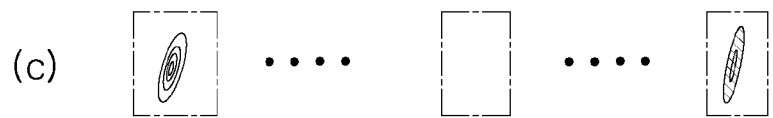

REFLECTED-WAVE PROCESSING APPARATUS

CROSS REFERENCE TO RELATED PATENT APPLICATION

This application claims the benefit under 35 U.S.C. Section 371, of PCT International Application No. PCT/KR2016/013482, filed on Nov. 22, 2016, which claimed priority to Korean Patent Application No. KR 10-2016-0142899, filed on Oct. 31, 2016, the disclosures of which are hereby incorporated by the references.

TECHNICAL FIELD

The present disclosure relates to a reflected-wave processing apparatus.

BACKGROUND ART

A reflected-wave measurement method is to measure a signal reflected after a signal is applied to a cable and to diagnose and check a cable included in an electrical power system. In a cable, electromagnetic waves of an electrical signal are determined by resistance, inductance, and capacitance of the cable, and a local change in impedance may cause reflected waves at the point of change when an electrical signal is applied. Thus, the reflected-wave measurement method may detect abnormalities of a cable and positions of abnormalities by analyzing waveforms of the reflected waves.

There are several types of reflected wave measurement methods, which are, time domain reflectometry (TDR), frequency domain reflectometry (FDR), and time-frequency domain reflectometry (TFDR), depending on a type of a signal. The TDR is to apply a step signal or a pulse signal having resolution in a time width and to analyze reflected waves in a time domain. The FDR is to apply sine waves having resolution in a frequency domain and to analyze reflected waves in a frequency domain. The TFDR is to diagnose whether a cable has defects with a relatively high accuracy by resolving limitations of the TDR and the FDR.

A device for processing reflected waves in a time-frequency domain is to input a reference signal and to analyze reflected waves obtained from a test subject. The TFDR uses a chirp signal of which a frequency increases linearly over time as a reference signal and analyzes a reflected signal reflected from a point at which impedance changes along with a reference signal in a time-frequency domain through a Wigner-Ville distribution and a cross-correlation function.

A general time-frequency domain reflected-wave measurement method uses only a chirp signal (an up-chirp signal, a positive-chirp signal, or the like) of which a frequency increases over time, and uses only a single chirp signal having a certain frequency band. Accordingly, a distance resolution of the general method has limited ability, and if a frequency characteristic of a cable is not known, the application thereof is limited. To address the issue, reference 1 suggests a method of overlapping signals being perpendicular to each other and present in different frequency domains in the same time width. The method may improve resolution, but an error caused by a loss of a high frequency element occurring while passing through lossy media has not been resolved. Thus, when only a chirp signal of which a frequency increases over time is used as a reference signal, a time may be decreased by a certain period of time from a time delay (td) of a firstly reflected signal, and the longer the length of a cable, the higher the error described above may increase, and thus, the issue may need to be resolved.

Also, a general time-frequency domain reflected-wave measurement method uses a localized Wigner-Ville distribution during a data process of a signal acquired through a waveform acquiring device. However, a cross-term may be generated at a point of an arithmetic mean between a position of a reference signal and a position of a reflected signal in the Wigner-Ville distribution and a point of an arithmetic mean between frequencies. To address the issue above, reference 2 suggests the method of using a moving window, and the method calculates a localized Wigner-Ville distribution by movement as much as a unit sample. Reference 2, however, performs the calculation using a localized moving window only in a time domain, and a cross-term generated in the same time slot or a frequency element other than a bandwidth of a reference signal may degrade performance of the TFDR (Korean Patent registration No. 10-1579896, and Korean Patent Application No. 10-2015-0155058)

DISCLOSURE

Technical Problem

An aspect of the present disclosure is to provide a reflected-wave processing apparatus which may accurately detect a time delay of a reflected signal and may remove effects from a cross-term.

Technical Solution

A reflected-wave processing apparatus according to one embodiment of the present invention may comprise: a reference signal generation unit for applying, to a cable, a first reference signal, the frequency of which increases over time, and a second reference signal, the frequency of which decreases over time; a reflected-signal acquisition unit for acquiring a first reflected signal and a second reflected signal which are reflected from the cable upon applying the first and second reference signals thereto; and a signal analysis unit for analyzing the first and second reflected signals.

Advantageous Effects

According to an example embodiment in the present disclosure, defects of a cable may be accurately determined by accurately detecting a time delay of a reflected signal and removing effects from a cross-term.

DESCRIPTION OF DRAWINGS

FIG. 1 is a block diagram illustrating a reflected-wave processing apparatus according to an example embodiment in the present disclosure;

FIG. 2 is a diagram illustrating a form of connection between a reflected-wave processing apparatus and a cable according to an example embodiment in the present disclosure;

FIG. 3 is a flowchart illustrating a method of processing reflected waves according to an example embodiment in the present disclosure;

FIGS. 4 and 5 are graphs of a reference signal and a reflected signal according to an example embodiment in the present disclosure;

FIG. 6 is a flowchart illustrating a method of calculating a Wigner-Ville distribution according to an example embodiment in the present disclosure; and FIG. 7 is a graph illustrating calculation of a Wigner-Ville distribution according to an example embodiment in the present disclosure.

BEST MODE FOR INVENTION

In the descriptions below, the present disclosure will be described based on the most appropriate example embodiments for an understanding of technical features in the present disclosure. It is to be understood that the technical features of the present invention are not limited to the example embodiments, and the present invention may be implemented as in the example embodiments described herein. Thus, the present invention may be modified in various manners through the example embodiments described herein within the technical scope of the present invention, and the modified example embodiments are to be included in the technical scope of the present invention. Also, to help in an understanding of the example embodiments, as for reference numerals in the attached drawings, relevant elements among elements having the same function in the example embodiments are indicated by the same or similar forms of reference numeral.

Hereinafter, example embodiments of the present disclosure will be described with reference to the accompanying drawings.

FIG. 1 is a block diagram illustrating a reflected-wave processing apparatus according to an example embodiment. Referring to FIG. 1, a reflected-wave processing apparatus 10 may include a reference signal generation unit 100, a reflected-signal acquisition unit 200, and a signal analysis unit 300. The reflected-wave processing apparatus 10 may include at least one processing unit and a memory. The processing unit may include a central processing unit (CPU), a graphics processing unit (GPU), a microprocessor, an application specific integrated circuit (ASIC), a field programmable gate array (FPGA), and the like, for example, and may have a plurality of cores. The memory may be a volatile memory (e.g., a RAM, and the like), a non-volatile memory (e.g., a ROM, a flash memory, and the like), or combinations thereof.

The reference signal generation unit 100 may generate a reference signal provided to a cable 20. The reference signal generation unit 100 may include an arbitrary waveform generator. The reference signal may include a first reference signal and a second reference signal.

The reflected-signal acquisition unit 200 may obtain a reflected signal reflected from the cable 20. The reflected-signal acquisition unit 200 may include a digital storage oscilloscope. The reflected signal may include a first reflected signal and a second reflected signal.

The signal analysis unit 300 may control generation of a reference signal of the reference signal generation unit 100, and may analyze a reflected signal provided from the reflected-signal acquisition unit 200 and may determine a position of a defect of the cable 20.

FIG. 2 is a diagram illustrating a form of connection between a reflected-wave processing apparatus and a cable according to an example embodiment. Referring to FIG. 2, a reflected-wave processing apparatus 10 may be connected to a cable 20 through a connector 30.

Referring to FIG. 2, the cable 20 may include a former 21, a conducting layer 22, an insulating layer 23, and a shielding layer 24. The former 21, the conducting layer 22, the insulating layer 23, and the shielding layer 24 may be disposed in order in the cable 20. The former 21 may bypass a fault current when a fault occurs, the conducting layer 22 may be formed of a superconductor and a driving current may flow in the conducting layer 22, the insulating layer 23 may be formed of a Polypropylene laminated paper (PPLP), and may insulate the conducting layer 22 and the shielding layer 24 to maintain a driving voltage. The shielding layer 24 may also be formed of a superconductor, and may induce a shield current and may shield a magnetic field to be emitted.

Referring to FIG. 2, the reflected-wave processing apparatus 10 may be connected to the conducting layer 22 and the shielding layer 24 of the cable 20. The conducting layer 22 and the shielding layer 24 each may include a wire rod bundle including a plurality of wire rods, and the reflected-wave processing apparatus 10 may be connected to the wire rod bundle. For example, a reference signal generation unit 100 of the reflected-wave processing apparatus 10 may be connected to a superconductor of the conducting layer 22 via a positive electrode of the connector 30 and may provide a reference signal, and the reflected-signal acquisition unit 200 may be connected to a superconductor of the shielding layer 24 via a negative electrode of the connector 30 and may obtain a reflected signal.

FIG. 3 is a flowchart illustrating a method of processing reflected waves according to an example embodiment.

As for the method of processing reflected waves, a first reference signal and a second reference signal may be generated in a reference signal generation unit 100, and the first reference signal and the second reference signal may be provided to a cable (S310). The first reference signal may be a chirp signal (a positive chirp signal, an up-chirp signal, or the like) of which a frequency increases over time, and the second reference signal may be a chirp signal (a negative chirp signal, a down-chirp signal, and the like) of which a frequency decreases over time.

When the first reference signal and the second reference signal are provided from the reference signal generation unit 100 to the cable, the reflected-signal acquisition unit 200 may obtain a first reflected signal and a second reflected signal reflected from the cable 20 (S320). The first reflected signal may be a signal reflected when the first reference signal is provided to the cable, and the second reflected signal may be a signal reflected when the second reference signal is provided to the cable. To prevent the first reflected signal and the second reflected signal from interfering with each other, the first reference signal and the second reference signal may be provided at different timings. For example, the first reference signal may be provided and the first reflected signal may be obtained, and then the second reference signal may be provided and the second reflected signal may be obtained. The signal analysis unit 300 may analyze the first reflected signal and the second reflected signal (S330).

FIG. 4 is graphs of a reference signal and a reflected signal according to an example embodiment.

FIG. 4 illustrates a first reference signal (Ws(t,w)), an ideal first reflected signal (Ws(t−td, w)), and an actual first reflected signal (Wr(t,w)). FIG. 5 illustrates a second reference signal (Ws(t,w)), an ideal second reflected signal (Ws(t−td,w)), and an actual second reflected signal (Wr(t, w)).

A High frequency element of the first and second reference signals passing through a medium such as a cable may be lost over time as compared to a low frequency element. If it is assumed that attenuation characteristics and a degree of dispersion of a medium such as a cable is linear, a signal reaching position x in a cable at time t may be represented by Equation 1 as below.

$$u(x, t) = 1/\sqrt{2} \int_{-\infty}^{\infty} S(\omega, x) e^{-j\omega t} d\omega \text{ where}$$ [Equation 1]

$$S(\omega, x) = S(\omega, x=0) \cdot H(\omega, x; T) = S(\omega, x=0) e^{-(A\omega - jK\omega)x}$$

In Equation 1, S(w,x) may represent a signal in a frequency domain, and H(w,x;T) may represent attenuation characteristics and a degree of dispersion of a cable in accordance with a length and a temperature of the cable. S(w,x=0) may indicate a signal at a starting portion of the cable, and may represent an initial signal with no attenuation. If it is assumed that attenuation characteristics and a degree of dispersion of a medium such as a cable is linear, H(w,x;T) may be represented by A, an attenuation constant, and K, a wave number.

In accordance with Equation 1 above, a central frequency at position x of the cable may be represented by Equation 2 as below.

$$\omega_{u(x)} = \int_{-\infty}^{\infty} \omega |S(\omega, x)|^2 d\omega =$$ [Equation 2]

$$\int_{-\infty}^{\infty} \omega |S(\omega, 0)|^2 \cdot |H(\omega, x)|^2 d\omega = \omega_0 - \frac{\alpha^2 + \beta^2}{\alpha} Ax$$

In Equation 2, $w_0$ may indicate a center frequency of a signal at a starting portion of the cable, α may indicate a constant which determines time widths of the first and second reference signals, and β may indicate a constant which determines a chirp rate of the chirp signals, the first and second reference signals. Referring to Equation 2, $w_0$, a center frequency observed at the position x in the cable, may be decreased by $\delta w=((\alpha^2+\beta^2)*Ax)/\alpha$ as compared to the ideal signal. δw and δt in FIG. 4 and FIG. 5, generated due to attenuation of a high frequency element, may be represented by Equation 3 as below.

$$\delta\omega = \frac{\alpha^2 + \beta^2}{\alpha} Ax$$ [Equation 3]

$$\delta t = \frac{\delta\omega}{\beta}$$

Referring to FIG. 3, due to the lost high frequency element, a time delay of the first reflected signal may be decreased by δt as compared to a time delay td of the ideal first reflected signal, and a time delay of the actual second reflected signal may be increased by δt as compared to a time delay td of the ideal second reflected signal.

Thus, according to the example embodiment, a signal analysis unit 300 may obtain an arithmetic mean between the first reflected signal and the second reflected signal, and may attenuate the time delay δt, which has a different sign. Thus, the signal analysis unit 300 in the example embodiment may calibrate the time delay value and the center frequency value, and may calculate a time delay value and a center frequency value from which an error is removed. The signal analysis unit 300 may accurately identify whether the cable has a defect and a position of a defect using the time delay value and the center frequency value from which an error of the reflected signal is removed.

The signal analysis unit 300 in the example embodiment may calculate a Wigner-Ville distribution of a reflected signal with respect to a reference signal, and may calculate a cross-correlation function of the reference signal and the reflected signal.

The calculation of the Wigner-Ville distribution and the cross-correlation function may be applied in relation to the first and second reference signals and the first and second reflected signals. For example, the signal analysis unit 300 may calculate a Wigner-Ville distribution of the first reflected signal with respect to the first reference signal, and may calculate a cross-correlation function of the first reference signal and the first reflected signal. The signal analysis unit 300 may calculate a Wigner-Ville distribution of the second reflected signal with respect to the second reference signal, and may calculate a cross-correlation function of the second reference signal and the second reflected signal.

In the description below, the first reference signal and the second reference signal will be referred to as a reference signal, and the first reflected signal and the second reflected signal will be referred to as a reflected signal.

A cross-term may be generated due to non-linearity of a Wigner-Ville distribution at an arithmetic mean between a reference signal and a reflected signal of the Wigner-Ville distribution. The cross-term may be recognized as a malfunction point in a time-frequency domain reflectometry, or may decrease similarity to a reference signal during a calculation process of a cross-correlation function, which may degrade performance.

FIG. 6 is a flowchart illustrating a method of calculating a Wigner-Ville distribution according to an example embodiment. FIG. 7 is a graph illustrating calculation of a Wigner-Ville distribution according to an example embodiment.

Referring to FIG. 6, as for the method of calculating a Wigner-Ville distribution in the example embodiment, a Wigner-Ville distribution of a reflected signal may be calculated using a localized moving window corresponding to a time width of a reference signal (S610). FIG. 7(a) illustrates a reference signal and a reflected signal in a time width. The Wigner-Ville distribution illustrated in FIG. 7(b) may be calculated using the localized moving window (window_1-window_n) corresponding to the time width illustrated in FIG. 7(a). For example, the Wigner-Ville distribution may be calculated from a region of the localized moving window corresponding to the time width. The Wigner-Ville distribution calculated in the step S610 may remove a cross-term generated between the reference signal and the reflected signal, but a cross-term generated at the same time slot, which may affect a size of the cross-correlation function, may remain, or a noise element may remain in a frequency different from a frequency of the reference signal.

According to the example embodiment, the above-described issue may be resolved by limiting a Wigner-Ville distribution calculated in accordance with a bandwidth of the reference signal after a Wigner-Ville distribution of the reflected signal is calculated using the localized moving window (S620). When the Wigner-Ville distribution calculated from the localized moving window (window_1-window_n) illustrated in FIG. 7(b) is limited in accordance with a bandwidth of the reference signal, a Wigner-Ville distribution may be calculated as in FIG. 7(c).

In the description below, a method of determining a bandwidth of a reference signal will be described with reference to Equation 4 as below. Equation 4 may represent a reference signal in a time domain.

$$s(t) = \left(\frac{\alpha}{\pi}\right)^{1/4} e^{-\alpha(t-t_0)^2/2 + j\beta(t-t_0)^2/2 + j\omega(t-t_0)} \quad \text{[Equation 4]}$$

In Equation 4, $t_0$ may indicate a center value of a time width of the reference signal, $\alpha$ may indicate a constant which determines a time width of the reference signal, and $\beta$ may indicate a constant which determines a chirp rate of a chirp signal, the reference signal. Referring to Equation 4, the reference signal has a form in which a frequency changes linearly over time within a Gaussian envelope. The reference signal in a time width may be transformed to a frequency domain through a fourier transform, and a mean and a standard deviation of the Gaussian envelope of the signal in the frequency domain may be calculated through a Gaussian fitting of the reference signal in the given frequency domain. Generally, 99% of energy of a signal in a frequency domain may be present within $3\sigma$ ($\sigma$: standard deviation), and thus, $3\sigma$ may be determined as a bandwidth of the reference signal.

The signal in the frequency domain other than the determined bandwidth of the reference signal may be removed by an ideal filter, and a cross-correlation function of the reference signal and the reflected signal may be analyzed for the signal in the time-frequency domain within the bandwidth.

While the example embodiments have been shown and described above, it will be apparent to those skilled in the art that modifications and variations could be made without departing from the scope of the present invention as defined by the appended claims.

The present disclosure has been described by specific features such as specific elements and limited example embodiments and drawings, but the example embodiments are provided to help understanding of the present disclosure, and the present disclosure is not limited to the example embodiments, and various modifications and variations thereof may be made by those skilled in the art.

Thus, the present disclosure is not limited to the example embodiments, but the scope of the present disclosure is defined only by appended claims, appropriately interpreted, along with the full range of equivalents to which the claims are entitled.

The invention claimed is:

1. A reflected wave processing apparatus, comprising:
   a reference signal generation unit providing a first reference signal of which a frequency increases over time, and a second reference signal of which a frequency decreases over time, to a cable;
   a reflected-signal acquisition unit acquiring a first reflected signal and a second reflected signal reflected from the cable in accordance with provision of the first reference signal and the second reference signal; and
   a signal analysis unit analyzing the first reflected signal and the second reflected signal,
   wherein the signal analysis unit obtains an arithmetic mean between the first reflected signal and the second reflected signal, and
   wherein the signal analysis unit obtains an arithmetic mean between the first reflected signal and the second reflected signal and calibrates a time delay and a center frequency of each of the first reflected signal and the second reflected signal.

2. The reflected-wave processing apparatus of claim 1, wherein the reference signal generation unit provides the first reference signal and the second reference signal to the cable at different timings.

3. The reflected-wave processing apparatus of claim 1, wherein the reference signal generation unit is connected to a conducting layer of the cable, and the reflected-signal acquisition unit is connected to a shielding layer of the cable.

4. A reflected-wave processing apparatus, comprising:
   a reference signal generation unit providing a reference signal of which a frequency changes over time to a cable;
   a reflected-signal acquisition unit obtaining a reflected signal reflected from the cable in accordance with provision of the reference signal; and
   a signal analysis unit calculating a Wigner-Ville distribution of the reflected signal using a localized moving window corresponding to a time width of the reference signal, and limiting the calculated Wigner-Ville distribution in accordance with a bandwidth of the reference signal,
   wherein the signal analysis unit transforms a reference signal having the time width to a frequency domain, and applies a Gaussian fitting to a reference signal to the frequency domain.

5. The reflected-wave processing apparatus of claim 4, wherein the signal analysis unit calculates a Wigner-Ville distribution of the reference signal from the localized moving window.

6. The reflected-wave processing apparatus of claim 4, wherein the signal analysis unit removes a signal in a frequency domain other than a bandwidth of the reference signal.

7. The reflected-wave processing apparatus of claim 4, wherein the signal analysis unit determines the bandwidth in accordance with a standard deviation of a Gaussian envelope based on the Gaussian fitting.

8. The reflected-wave processing apparatus of claim 7, wherein the signal analysis unit determines a threefold of the standard deviation as the bandwidth.

9. The reflected-wave processing apparatus of claim 4, wherein the reference signal generation unit is connected to a conducting layer of the cable, and the reflected-signal acquisition unit is connected to a shielding layer of the cable.

10. A reflected-wave processing apparatus, comprising:
    a reference signal generation unit providing a first reference signal of which a frequency increases over time, and a second reference signal of which a frequency decreases over time, to a cable;
    a reflected-signal acquisition unit acquiring a first reflected signal and a second reflected signal reflected from the cable in accordance with provision of the first reference signal and the second reference signal; and
    a signal analysis unit analyzing the first reflected signal and the second reflected signal,
    wherein the reference signal generation unit is connected to a conducting layer of the cable, and the reflected-signal acquisition unit is connected to a shielding layer of the cable.

11. The reflected-wave processing apparatus of claim 10, wherein the reference signal generation unit provides the first reference signal and the second reference signal to the cable at different timings.

12. The reflected-wave processing apparatus of claim 10, wherein the signal analysis unit obtains an arithmetic mean between the first reflected signal and the second reflected signal.

* * * * *